United States Patent
Blondin et al.

(10) Patent No.: US 9,887,487 B2
(45) Date of Patent: Feb. 6, 2018

(54) DEVICE AND METHOD FOR INTERCONNECTING ELECTRONIC SYSTEMS HAVING DIFFERENT REFERENCE POTENTIALS

(75) Inventors: Christophe Blondin, Nimes (FR); Christian Neel, Nimes (FR)

(73) Assignee: NANOTEC SOLUTION, Nimes (FR)

( * ) Notice: Subject to any disclaimer, the term of this patent is extended or adjusted under 35 U.S.C. 154(b) by 916 days.

(21) Appl. No.: 14/000,322

(22) PCT Filed: Jan. 30, 2012

(86) PCT No.: PCT/FR2012/050186
§ 371 (c)(1),
(2), (4) Date: Aug. 19, 2013

(87) PCT Pub. No.: WO2012/114009
PCT Pub. Date: Aug. 30, 2012

(65) Prior Publication Data
US 2013/0323942 A1    Dec. 5, 2013

(30) Foreign Application Priority Data

Feb. 21, 2011 (FR) .................................. 11 51390

(51) Int. Cl.
| | |
|---|---|
| H01F 27/42 | (2006.01) |
| H01F 37/00 | (2006.01) |
| H01F 38/00 | (2006.01) |
| H01R 13/62 | (2006.01) |
| H03K 17/691 | (2006.01) |

(Continued)

(52) U.S. Cl.
CPC ..... *H01R 13/6205* (2013.01); *G01R 27/2605* (2013.01); *H03K 17/691* (2013.01); *H03K 19/00369* (2013.01); *H01L 2224/4516* (2013.01); *H01L 2224/45565* (2013.01); *H01L 2224/48092* (2013.01); *H01L 2224/48137* (2013.01)

(58) Field of Classification Search
CPC ......... H02J 1/08; H03K 3/012; H03K 17/691; H03K 19/00369; H01R 13/6205; G01R 27/2605; G01R 27/2611
See application file for complete search history.

(56) References Cited

U.S. PATENT DOCUMENTS 3,931,554 A * 1/1976 Spentzas ................ H02K 33/12
310/30
4,802,055 A * 1/1989 Beckerman ............ H02H 9/005
361/111

(Continued)

FOREIGN PATENT DOCUMENTS

FR    2756048      5/1998
FR    2756048 A1 * 5/1998 ............. G01B 7/023

*Primary Examiner* — Rexford Barnie
*Assistant Examiner* — Rasem Mourad
(74) *Attorney, Agent, or Firm* — Greer, Burns & Crain, Ltd.

(57) ABSTRACT

A device is provided for interconnecting electronic systems having reference potentials separated by an alternating potential difference, the device includes a plurality of electrical connections that can electrically connect the electronic systems, and inductance coils arranged in series on the electrical connections, the inductance coils being electromagnetically coupled. Also provided is a method for interconnecting electronic systems.

10 Claims, 3 Drawing Sheets

(51) Int. Cl.
*H03K 19/003* (2006.01)
*G01R 27/26* (2006.01)

(56) References Cited

U.S. PATENT DOCUMENTS

| | | | | |
|---|---|---|---|---|
| 4,932,615 | A * | 6/1990 | Frazier | B61L 1/20 246/121 |
| 5,671,110 | A * | 9/1997 | McCartney | H04B 3/30 361/111 |
| 6,476,621 | B1 * | 11/2002 | Mallory | C04B 28/04 324/678 |
| 7,362,192 | B1 * | 4/2008 | Lin | H03B 5/1228 331/117 FE |
| 2001/0019608 | A1 * | 9/2001 | Lofmark | H03H 7/38 379/398 |
| 2002/0130110 | A1 * | 9/2002 | Kwon | H01J 37/321 219/121.54 |
| 2003/0048150 | A1 | 3/2003 | Clarke et al. | |
| 2003/0161166 | A1 * | 8/2003 | Mutoh | H02M 1/12 363/50 |
| 2007/0159860 | A1 * | 7/2007 | Haeberle | H02J 3/01 363/44 |
| 2009/0027937 | A1 * | 1/2009 | Kirchmeier | H01J 37/32045 363/133 |
| 2009/0252348 | A1 * | 10/2009 | Glissman | H01Q 1/243 381/107 |
| 2011/0001497 | A1 | 1/2011 | Chetelat et al. | |
| 2012/0014143 | A1 * | 1/2012 | Schueneman | H02M 1/126 363/40 |
| 2014/0145732 | A1 * | 5/2014 | Blondin | G01R 27/2605 324/679 |

* cited by examiner

DEVICE AND METHOD FOR INTERCONNECTING ELECTRONIC SYSTEMS HAVING DIFFERENT REFERENCE POTENTIALS

TECHNICAL FIELD

The present invention relates to a device and a method for interconnecting electronic systems having different reference potentials.

The field of the invention is more particularly, but non-limitatively, that of electronic isolation devices.

BACKGROUND

In general, electronic systems are referenced with respect to a ground potential, which can for example be a reference voltage with respect to which the power supply voltages are fixed. This ground may or may not be connected to the earth.

In certain cases, it is necessary for electronic sub-systems or parts to be referenced to potentials other than the ground potential of the overall system, and floating with respect to the latter. This scenario is encountered for example in measuring systems in order to be unaffected by electrical interferences that are sources of noise.

Sometimes, the floating part is not totally separated from the rest of the system by galvanic isolation but is only floating for high frequencies, or about a working frequency.

Special arrangements are necessary in order to be able to provide electrical power to a floating sub-system and to transmit analogue and/or digital signals between that floating system and the part referenced to the ground potential.

This scenario is for example encountered in the document FR 2 756 048 by Rozière which discloses a capacitive measuring system. The detection circuit comprises a high frequency floating part the reference potential of which oscillates with respect to the ground of the overall system at an oscillation frequency.

The power supply voltages are transmitted to the floating part via inductance coils or chokes placed in series in the power lines so as to have a high impedance at the oscillation frequency of the floating reference potential.

The same principle can be used for transmitting digital or analogue signals.

Signals can also be transmitted between the floating and non-floating parts by other known means such as differential amplifiers, photocouplers or radio transmission means.

Electronic functions must often be produced in the form of integrated electronic circuits with minimal overall dimensions and electrical consumption. This is particularly true for capacitive measuring systems which are increasingly used for producing touch sensitive interfaces of portable systems (telephones, computers, etc.).

In this context, the known means for transmitting signals between floating and non-floating parts have inconvenient drawbacks, such as high overall dimensions and consumption.

The purpose of the present invention is to propose a device making it possible to interconnect floating electronic systems with systems referenced to ground, which consume a minimum of energy and which can be produced with small overall dimensions.

SUMMARY

This objective is achieved with a device for interconnecting electronic systems having reference potentials separated by an alternating potential difference, comprising a plurality of electrical connections capable of electrically connecting said electronic systems, and inductance coils placed in series in said electrical connections, characterized in that said inductance coils are electromagnetically coupled.

The device according to the invention can moreover comprise:

an inductance coil connecting points at the reference potentials of the electronic systems;

a source of alternating excitation voltage connected by a first end to the reference potential of a first electronic system.

According to embodiments, the device according to the invention can moreover comprise a source of alternating excitation voltage connected by a second end to the reference potential of a second electronic system.

It can also comprise moreover a source of alternating excitation voltage connected by a second end to an intermediate connection point of an inductance coil.

According to other embodiments, the device according to the invention can comprise moreover an excitation inductance coil electromagnetically coupled to the inductance coils, and connected by a first end to the reference potential of a first electronic system and by a second end to a source of alternating excitation voltage.

The device according to the invention can moreover comprise:

inductance coils comprising windings arranged around a common ferromagnetic core;

inductance coils having substantially identical inductances;

inductance coils of which the electromagnetic coupling is optimised such that the mutual inductances between said inductance coils are comparable to their inductances;

at least one capacitor connected in parallel with at least one inductance coil;

electrical connections capable of transmitting at least one of the following signals: power supply voltage, digital signal, analogue signal.

The device according to the invention can be produced according to integrated electronics technologies, for example in the form of an integrated circuit or of an ASIC (Application-Specific Integrated Circuit).

It can be appropriate to interconnect integrated circuits or parts of integrated circuits.

According to another aspect, there is proposed an electronic capacitive measuring system comprising a first sub-system, electrically referenced to a floating guard potential, and a second sub-system electrically referenced to a ground potential, these guard and ground potentials being separated by an alternating potential difference, characterized in that it comprises moreover a device for interconnecting said first and second sub-systems according to the invention.

According to yet another aspect, there is proposed a method for interconnecting electronic systems with reference potentials separated by an alternating potential difference, comprising the steps:

of establishing electrical connections for electrically connecting said electronic systems, of insertion of inductance coils in series in said electrical connections, this method comprising moreover a step of establishing electromagnetic coupling between said inductance coils.

The interconnecting method can comprise moreover a step of winding inductance coils around a common ferromagnetic core.

BRIEF DESCRIPTION OF THE DRAWINGS

Other advantages and characteristics of the invention will become apparent on examination of the detailed description of an embodiment which is in no way limitative, and the attached diagrams, in which.

DETAILED DESCRIPTION

Examples of embodiments of interconnecting devices according to the invention for interconnecting electronic systems of which the reference potentials are connected by a periodic alternating signal (sinusoidal, square, triangular, etc.) will now be described.

Figure 1:
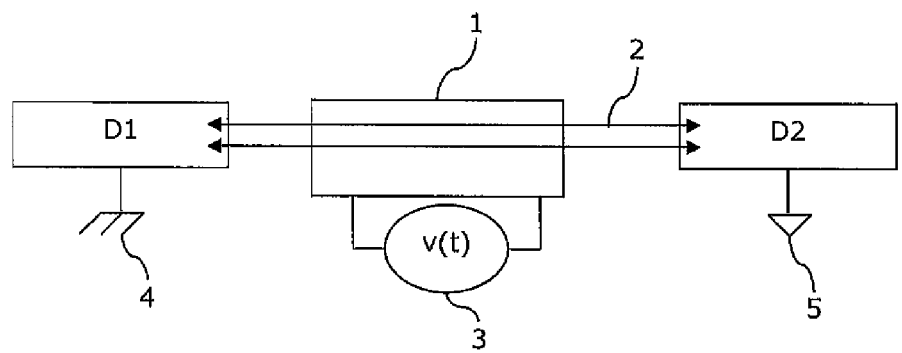
FIG. 1 shows the use of a device according to the invention for interconnecting two electronic systems of which the reference potentials are connected by a periodic signal.

With reference to FIG. 1, an interconnecting device 1 according to the invention is used for connecting electronic systems D1 and D2.

In the example in question, the electronic system D2 is electrically referenced to the ground or to the earth 5. The electronic system D1 is electrically referenced to a floating reference potential 4.

A source 3 of alternating excitation voltage connects (directly or indirectly) the ground 5 and the floating reference 4, in such a way as to cause the floating reference voltage 4 oscillate with respect to the ground 5.

The electronic systems D1 and D2 are connected by electrical connections 2 which make it possible to convey, for example, power supply voltages or digital or analogue signals.

The interconnecting device according to the invention 1 is inserted in series in these electrical connections 2, in such a way as to also ensure the excitation of the floating reference 4 by the source of excitation 3.

Figure 2:
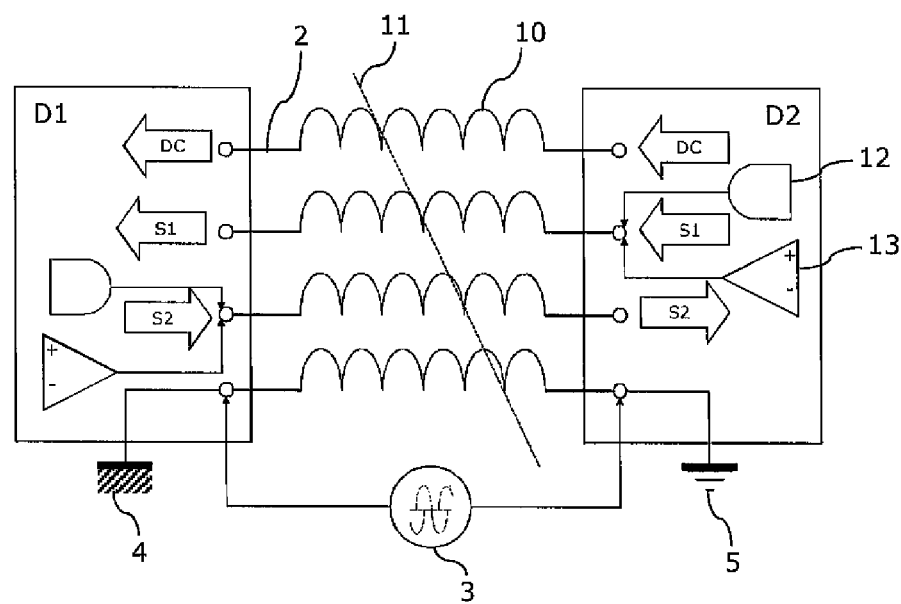
FIG. 2 shows a first embodiment of a device according to the invention, with a source of alternating excitation voltage of the floating potential which is connected to the reference potentials of a floating system and of a system referenced to the ground.

With reference to FIG. 2, according to a first embodiment, the alternating source of excitation 3 is connected to the ground 5 of the electronic system D2, on the one hand, and to the floating reference potential 4 of the electronic system D1 on the other hand.

The alternating source of excitation 3 can itself be referenced to the ground 5, in which case it excites the floating reference potential 4. It can also be referenced to the floating reference potential 4, in which case it excites the ground 5 with respect to this floating reference potential 4, which is substantially equivalent.

The device according to the invention comprises a plurality of inductance coils 10 placed in series in the electrical connections 2 connecting the systems D1 and D2, as well as between their respective reference potentials 4, 5.

These inductance coils 10 are arranged around a common ferromagnetic core 11 in such a way as to be magnetically (or electromagnetically) coupled.

The use of inductance coils 10 for achieving electrical isolations at high frequencies is known.

An inductance coil 10 has a complex impedance equal, ignoring the resistive part, to:

$$Z = jL\omega \qquad \text{(Eq. 1)}$$

where L is the inductance (in Henries, H) and $\omega = 2\pi f$ the angular frequency at the frequency f (in Hz).

Coils with a sufficiently high inductance L, placed in series, substantially behave like short-circuits for signals DC, S1, S2 to be transmitted between the circuits D1 and D2 (at relatively low frequencies), and like open circuits (or at least circuits with a very high impedance) at the frequency of the excitation source 3 provided that this frequency is sufficiently high. They thus make it possible to very effectively isolate the floating D1 and non-floating D2 circuits at high frequencies and in particular at the frequency of excitation of the source or of the oscillator 3.

A known drawback of these devices is their electrical consumption, which can prove to be excessive in the case of integrated electronic systems and/or those used in portable devices.

In order to estimate the current that the oscillator 3 must provide, it can be noted that in order for the isolation at the frequency of the oscillator 3 (or in other words the rejection of the signal of the oscillator 3) to be satisfactory, it is necessary that, at this frequency, the impedances of the inductance coils 10 are much higher than the impedances existing between, on the one hand, the lines 2 for conveying the DC power supplies and/or the signals S1 and S2 and, on the other hand, the respective reference potentials 4, 5 of the two electronic systems D1 and D2. On the basis of this approximation, at the frequency of the oscillator 3 a simplified circuit constituted by all the inductance coils 10 connected in parallel across the terminals of this source of excitation 3 is obtained.

With n inductance coils 10 of respective inductance $L_i$, the oscillator 3 which delivers the voltage U must therefore supply a current:

$$i = \frac{U}{Z} = \frac{U}{jL_{eq}\omega}, \qquad \text{(Eq. 2)}$$

where $L_{eq}$ is the inductance of all the coils in parallel. In the simple case in which all the inductances are identical ($L_i = L$), we have:

$$i = n\frac{U}{jL\omega} \qquad \text{(Eq. 3)}$$

This result corresponds to a case representative of the prior art in which there is no coupling between the coils 10.

According to the invention, the inductance coils 10 are strongly coupled magnetically.

Considering for example four coils 10 of respective inductances $L_i$ connected in parallel across the terminals of a source of excitation 3 delivering a voltage U, we have:

$$U = jL_1\omega i_1 + jM_{12}\omega i_2 + jM_{13}\omega i_3 + jM_{14}\omega i_4 \qquad \text{(Eq. 4)}$$
$$= jM_{12}\omega i_1 + jL_2\omega i_2 + jM_{23}\omega i_3 + jM_{24}\omega i_4$$
$$= jM_{13}\omega i_1 + jM_{23}\omega i_2 + jL_3\omega i_3 + jM_{34}\omega i_4$$
$$= jM_{14}\omega i_1 + jM_{24}\omega i_2 + jM_{34}\omega i_3 + jL_4\omega i_4$$

Where $i_i$ is the current flowing in the inductance $L_i$ and $M_{ij}$ is the mutual inductance due to the magnetic coupling between the inductance coils i and j. For demonstration, the simple case in which the inductances $L_i$ are identical ($L_i$=L) and the mutual inductances are also identical ($M_{ij}$=M) can be considered as before.

If in addition there is almost total magnetic (or electromagnetic) coupling between the inductance coils 10, the mutual inductances are substantially equal to the self-inductances (L=M) and the expressions of the voltage become simplified as follows:

$$U = jL\omega(i_1+i_2+i_3+i_4).$$

The current that the source of excitation 3 must provide then becomes:

$$i = \frac{U}{jL\omega} \qquad \text{(Eq. 5)}$$

Thus, according to a noteworthy result of the invention, the current consumed in all the electromagnetically coupled inductance coils 10 is substantially equal to the current which would be consumed in just one of them in the absence of coupling. This amounts to saying that for n inductance coils 10, the current consumed by a device according to the invention can be up to n times lower than the current consumed by a device of the prior art, without coupling between the coils.

According to another noteworthy result of the invention, it is possible to multiply the number of inductance coils 10 without notably affecting the current consumed. This effect is particularly advantageous for example for using a large number of parallel digital (or analogue) connections 2 between electronic systems D1, D2 having different reference potentials 4, 5.

According to yet another noteworthy result, the invention makes it possible to convey signals S1, S1 between the systems D1 and D2 with frequencies much higher than is possible with devices of the prior art in which the inductance coils are not electromagnetically coupled.

In order to explain this result, it is possible to consider a signal S2 (digital or analogue) which passes from the system D1 to the system D2. This signal S2 is transmitted through a first inductance coil 10, and the circuit is closed through a second inductance coil 10 which connects the respective reference potentials 4, 5 of the systems D1 and D2.

In a device of the prior art in which the inductance coils 10 are not magnetically coupled, in order that the signal S2 can be transmitted in good conditions it is necessary for the impedances of the inductance coils 10 in series in the circuit to be sufficiently low, in particular in comparison with the input impedance of line 2 (S2) on the D2 system side. This constraint limits the maximum permissible frequencies of the signal S2.

In a device according to the invention, the inductance coils 10 in series in the transmission circuit of S2 are magnetically coupled. It can be considered that there passes through the two coils constituting this circuit a current i that is substantially identical but flowing in the opposite direction (from the system D1 to the system D2 in the line 2 corresponding to S2 and from D2 to D1 between the reference potentials 5 and 4 in order to close the circuit). The expression of the voltage across the terminals of these inductance coils 10 is then:

$$U = jL\omega i - jM\omega i \qquad \text{(Eq. 6)}$$

As explained previously, there is almost total electromagnetic coupling between these inductance coils 10 with mutual inductances which are substantially equal to the self-inductances (L=M), the voltage across the terminals of these coils 10 therefore tends towards zero (U=0). The impedance of the inductance coils 10 no longer affects the transmission of the signals and it is therefore possible to transmit signals at all frequencies, and in particular at high frequencies.

According to an example embodiment, the inductance coils 10 are produced in the form of a multiple winding comprising a plurality of conductive wires electrically isolated from each other and surrounding a ferromagnetic core. The multiple winding can comprise a practically unlimited number of wires insofar as the impedance seen by the source of excitation 3 is substantially independent of the number of wires.

The device of the invention can thus be very compact, with an electrical consumption that is low compared with that of the devices of the prior art.

It also has the advantage of allowing production at a low cost.

Figure 3:
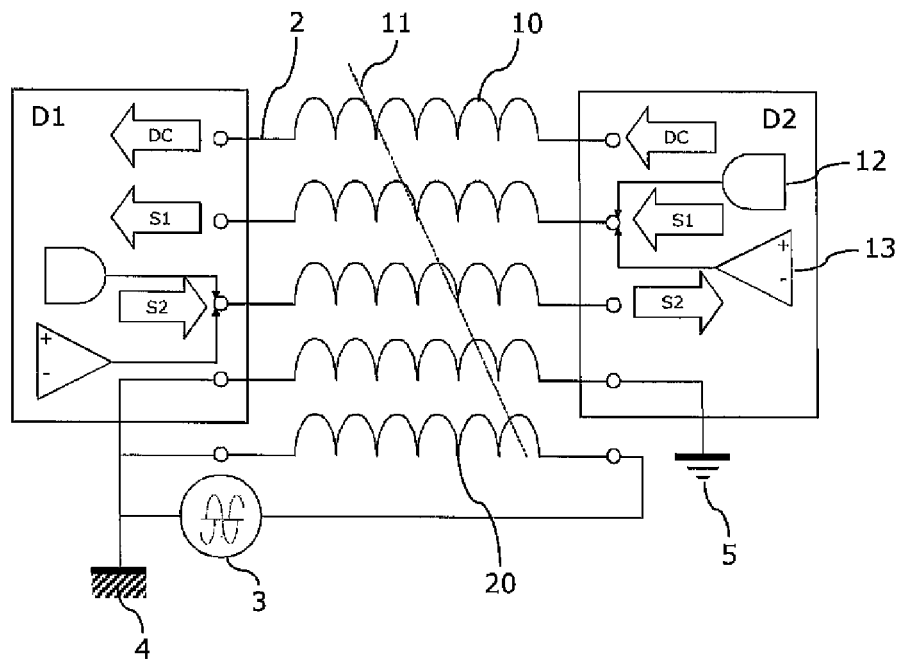
FIG. 3 shows a second embodiment of a device according to the invention, with a source of alternating excitation voltage of the floating potential which is connected to the reference potential of the floating system only.

With reference to FIG. 3, according to a second embodiment, the device according to the invention comprises moreover an excitation inductance coil 20 connected across the terminals of the source 3. This excitation coil 20 is magnetically (or electromagnetically) coupled with the other inductance coils 10 placed in series in the electrical connections 2. To achieve this, it is arranged (or wound) around the same ferromagnetic core 11 as the other coils 10.

The alternating source of excitation 3 is connected to the floating reference potential 4 of the electronic system D1. It is not connected (at least directly at its oscillation frequency) to the ground 5 of the electronic system D2.

This excitation coil 20, powered by the source 3, makes it possible to fix the potential difference between the reference potentials 4, 5 of the systems D1 and D2 by magnetic coupling with the other inductance coils 10. A transformer is thus formed the primary of which is the excitation coil 20 and the secondaries of which are the inductance coils 10.

Figure 4:
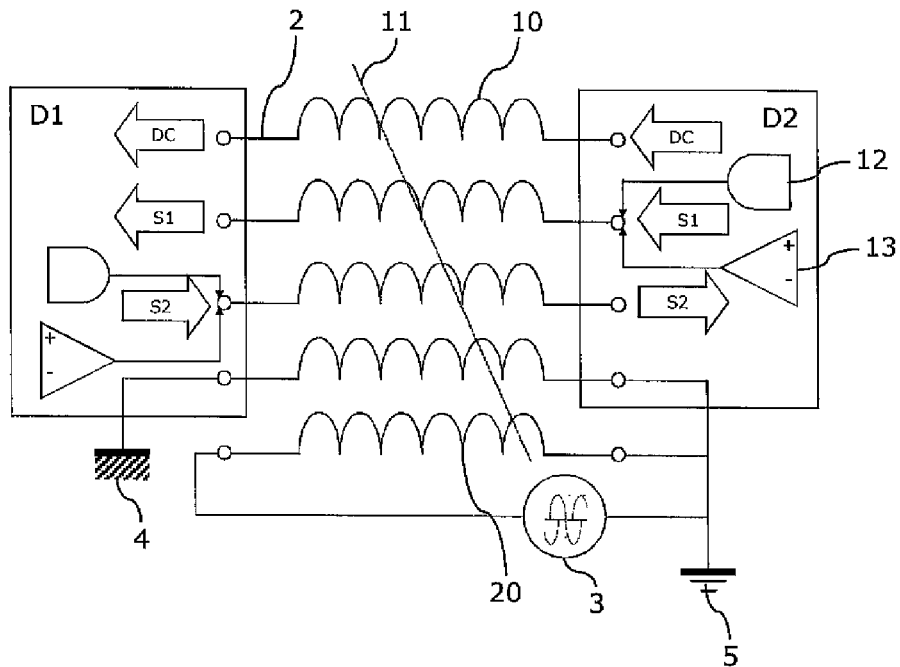
FIG. 4 shows the second embodiment of a device according to the invention, with a source of alternating excitation voltage of the floating potential which is connected to the reference potential of the system referenced only to the ground.

FIG. 4 shows the case that is symmetrical with the one shown in FIG. 3, corresponding to the same embodiment but in which the source is connected to the reference or ground potential 5 of the electronic system D2.

In this embodiment, the source of excitation 3 can be connected to either a floating or non-floating reference potential 4, 5 of one of the systems.

This embodiment with an excitation coil 20 makes it possible to improve the isolation between the source of excitation 3 and one of the systems D1 or D2. It also makes it possible to create potential differences between the reference potentials 4, 5 different from the voltage of the source of excitation 3, by using an excitation coil 20 with a number of turns that is different from that of the coupling coils 10.

Figure 5:
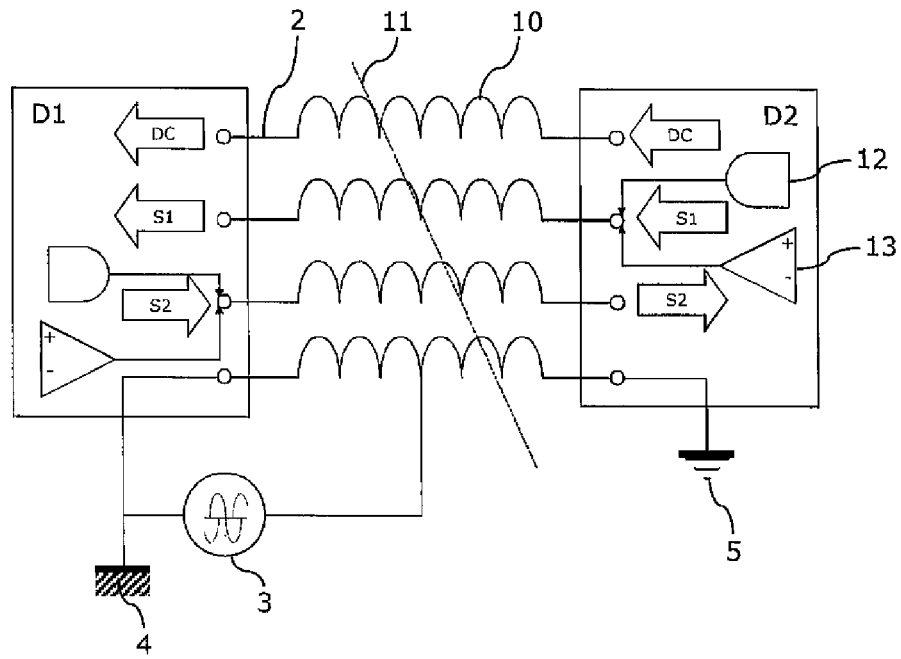
FIG. 5 shows a third embodiment of a device according to the invention, with a source of alternating excitation voltage of the floating potential which is connected to the reference potential of the floating system, and to an intermediate point of an inductance winding.

With reference to FIG. 5, according to a third embodiment, the alternating source of excitation 3 is connected to the floating reference potential 4 of the electronic system D1, and to an intermediate point of the inductance coil 10 connecting the reference potentials 4, 5 of the two systems D1 and D2.

This configuration, which is close to the one shown in FIG. 2, makes it possible to adjust the amplitude of the difference between the reference potentials 4 and 5 of the two systems D1 and D2 by using a source of excitation 3 delivering a periodic voltage of fixed amplitude. In fact, the inductance coils 10 appear, from the point of view of the points at the reference potentials 4, 5 and at high frequencies, as being connected in parallel and the coil 10 to which the source is connected at a mid point behaves like an impedance dividing bridge. The amplitude of the difference between the reference potentials 4 and 5 can be varied by varying the position of the point of connection of the source 3 or, in other words, the relative value of the inductances on either side of that point.

Figure 6:
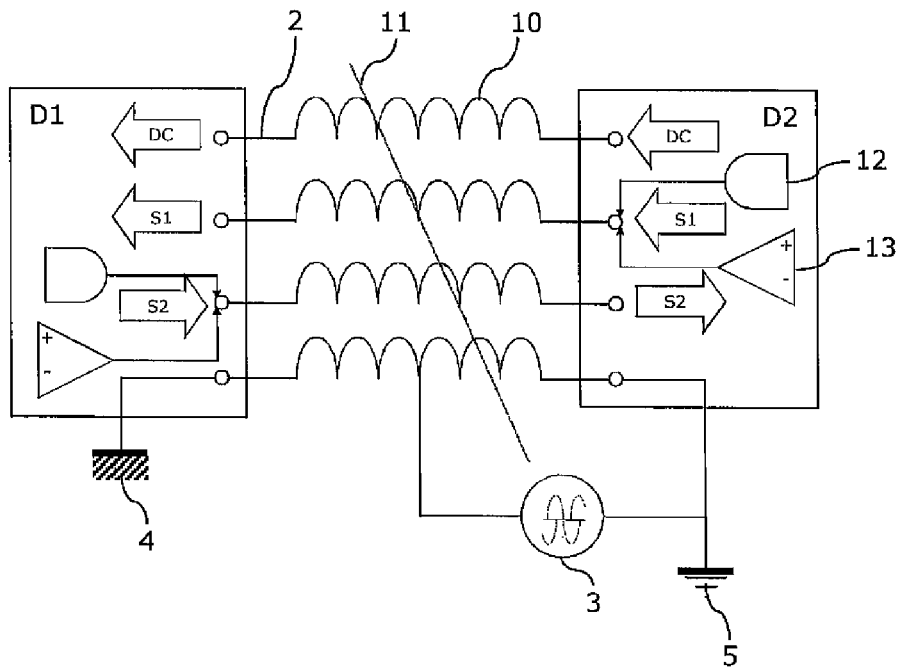
FIG. 6 shows the third embodiment of a device according to the invention, with a source of alternating excitation voltage of the floating potential which is connected to the reference potential of the system referenced to the ground, and to an intermediate point of an inductance winding.

FIG. 6 shows the case that is symmetrical with the one shown in FIG. 5, corresponding to the same embodiment but in which the source is connected to the reference or ground potential 5 of the electronic system D2.

In this embodiment, it is also possible to connect the source of excitation 3 to either a floating or non-floating reference potential 4, 5 of one of the systems.

According to a variant applicable to all of the embodiments, it is possible to add one or more capacitors or condensers in parallel with one or more inductance coils 10 between the systems D1 and D2. It is also possible to place a condenser in parallel with an excitation coil 20.

In this way, resonant circuits are formed the resonant frequencies of which can advantageously be adjusted to be substantially identical to the frequencies of the excitation source 3.

The impedances as seen by the source 3 and between the systems D1 and D2 at the resonant frequencies are thus considerably increased, which has the advantage of further reducing the current consumed and of providing better isolation.

Depending on the embodiments, the inductance coils 10 can be produced according to all types of technologies. They can in particular be produced in the form of tracks deposited or etched on a support by a silkscreen printing or photolithographic process, or by any other process used in microelectronics.

As all of the inductance coils 10 are magnetically coupled, they can moreover be produced with minimum overall dimensions.

A device according to the invention can also be produced using existing components for other applications, such as four-wire coils or common-mode chokes.

The device according to the invention makes it possible to transmit all types of signals, in any direction, between electronic systems D1 and D2 of which the reference potentials are connected by a periodic signal. The following can be mentioned by way of non-limitative examples:

DC or low frequency power supply voltages coming from voltage sources referenced to the reference potential 5 of the system D2.
  These power supply voltages, once transferred into the system D1 through the inductance coils 10, become referenced to the reference potential 4 of the system D1. It is thus possible to power a system D1 with a power supply source of a system D2 and vice-versa;

Digital or analogue signals at all frequencies, respectively coming from logic components 12 or from analogue components 13 of the system D2 referenced through their power supply to the reference potential 5. These signals, once transferred into the floating system D1 through the inductance coils 10, become referenced to the reference potential 4 in the floating system D1 (and vice-versa);

Signals in differential mode, digital or analogue;

Signals conveyed on bidirectional electrical connections 2.

Devices according to the invention can advantageously be used in a great variety of electronic systems which necessitate grounds at different potentials but not necessarily isolated.

The device according to the invention is particularly well suited for carrying out the interconnection between the floating part and the part referenced to the ground or earth of a floating bridge capacitive measuring system such as described for example in the document FR 2 756 048 by Rozière. In fact, in this application, the detection circuit comprises a floating part of which the reference potential, called the guard potential, oscillates with respect to the ground of the overall system or to the earth. The alternating potential difference between the guard potential and ground is generated by an oscillator. In the embodiments described in FR 2 756 048, the interconnections between the part referenced to the guard and the part referenced to ground are notably carried out through DC/DC converters in order to transmit the power supplies to the floating part referenced to the guard and differential amplifiers for transmitting the measuring signals coming from this floating part.

These floating bridge capacitive measuring electronics can be improved by integrating a device according to the invention in them. For example, the embodiments shown in FIG. 1 can be used in them. In order to make the notations consistent, it is considered that the floating capacitive bridge referenced to the guard corresponds to the system D1 shown in FIG. 1 and the part referenced to ground or to earth corresponds to the system D2.

The device according to the invention can be integrated in the capacitive bridge of FR 2 756 048 as follows:

The source of excitation 3 is used as an oscillator. In capacitance measuring mode, it is connected directly on the one hand to the guard 4 of the system D1 and on the other hand to the ground 5 of the system D2;

The electrical analogue and digital connections (if for example a microprocessor is integrated for processing the signal in the part referenced to the guard 4) between the floating D1 and non-floating D2 parts are carried out through inductance coils 10 that are all electromagnetically coupled;

The guard 4 and the ground 5 are connected through an inductance coil 10;

The DC/DC converter is replaced by inductance coils 10 making it possible to transfer the power supplies generated in the part D2 referenced to the ground into the part D1 referenced to the guard;

The differential amplifier for the transmission of the measurement signal (as well as other possible signal transmission means) is also replaced by one or more coupled inductance coils 10.

It is also possible to use other embodiments of the device according to the invention in a floating capacitive bridge. Moreover, all variants of implementation are of course possible within the scope of the invention.

The use of the invention in the floating capacitive bridge of FR 2 756 048 constitutes an improvement of this technique which makes its integration easier and more effective in compact electronic, integrated and/or low-consumption systems (or its production in the form of such circuits) such as for example touch sensitive and non-contact interfaces based on capacitive detection for smartphones, or various data processing systems.

The invention can also be used in very varied applications, among which the following can be mentioned in particular:

all capacitive measuring systems or based on another physical principle comprising a part having a floating potential;

control systems for stages using power field effect transistors (FET);

systems comprising microprocessors connected by a serial or parallel connection;

systems comprising a USB, Bluetooth™ or WIFI communications module and receiving data from another system through a USB protocol or a serial connection;

applications in which it is necessary to limit alternating interference currents between systems and to provide electromagnetic protection (EMC);

all applications necessitating the interconnection of electronic systems all or some of the reference voltages of which are floating with alternating potential differences.

Of course, the invention is not limited to the examples which have just been described and numerous adjustments can be made to these examples without exceeding the scope of the invention.

The invention claimed is:

1. A device for interconnecting electronic systems with respective reference potentials, the reference potentials being different from each other and separated by an alternating potential difference, the device comprising:
   a plurality of electrical connections configured for electrically connecting said electronic systems;
   inductance coils each placed in series in between said electrical connections, wherein said inductance coils are electromagnetically coupled and comprise windings arranged around a common ferromagnetic core;
   a source of alternating excitation voltage including a first end and a second end, said first end being connected directly, or indirectly through one of the inductance coils, to a floating reference potential of a first electronic system and said second end being connected directly, or indirectly through one of the inductance coils, to a ground reference potential of a second electronic system in such a way as to cause the floating reference potential to oscillate with respect to the ground reference potential.

2. The device according to claim 1, further comprising an inductance coil connected to the reference potentials of the electronic systems.

3. The device according to claim 1, wherein the source of alternating excitation voltage is connected by a second end to an intermediate connection point of an inductance coil.

4. The device according to claim 1, further comprising an excitation inductance coil electromagnetically coupled to the inductance coils, and connected by the first end to the reference potential of the first said electronic system and by a second end to the source of alternating excitation voltage.

5. The device according to claim 1, wherein the inductance coils have substantially identical inductances.

6. The device according to claim 1, wherein the inductance coils of which the electromagnetic coupling is optimized such that the mutual inductances between said inductance coils are comparable to their inductances.

7. The device according to claim 1, wherein the electrical connections are configured for transmitting at least one of the following signals: power supply voltage, digital signal, analogue signal.

8. The device according to claim 1, wherein the device is produced according to integrated electronics technologies.

9. The device according to claim 1, wherein the device is configured for interconnecting integrated circuits or parts of integrated circuits.

10. A method for interconnecting electronic systems with respective reference potentials, the reference potentials being different from each other and separated by an alternating potential difference, the method comprising the steps of:
   establishing electrical connections for electrically connecting the electronic systems;
   inserting inductance coils, each of said inductance coils in series in between said electrical connections;
   connecting a source of alternating excitation voltage including a first end and a second end, said first end being connected directly, or indirectly through one of the inductance coils, to a floating reference potential of a first electronic system and said second end being connected directly, or indirectly through one of the inductance coils, to a ground reference potential of a second electronic system in such a way as to cause the floating reference potential to oscillate with respect to the ground reference potential;
   winding the inductance coils around a common ferromagnetic core; and
   establishing electromagnetic coupling between said inductance coils.

* * * * *